US007289162B2

(12) United States Patent
Choi et al.

(10) Patent No.: US 7,289,162 B2
(45) Date of Patent: Oct. 30, 2007

(54) VSB RECEPTION SYSTEM WITH ENHANCED SIGNAL DETECTION FOR PROCESSING SUPPLEMENTAL DATA

(75) Inventors: In Hwan Choi, Seoul (KR); Young Mo Gu, Seoul (KR); Kyung Won Kang, Seoul (KR); Kook Yeon Kwak, Kyonggi-do (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 11/560,307

(22) Filed: Nov. 15, 2006

(65) Prior Publication Data

US 2007/0070252 A1    Mar. 29, 2007

Related U.S. Application Data

(63) Continuation of application No. 11/430,445, filed on May 8, 2006, now Pat. No. 7,167,212, which is a continuation of application No. 10/791,460, filed on Mar. 1, 2004, now Pat. No. 7,068,326, which is a continuation of application No. 09/933,206, filed on Aug. 20, 2001, now Pat. No. 6,760,077.

(30) Foreign Application Priority Data

Jan. 19, 2001   (KR) .................................. 2001-3304

(51) Int. Cl.
*H04N 5/213*    (2006.01)
*H04N 5/38*     (2006.01)
*H04N 5/44*     (2006.01)

(52) U.S. Cl. ...................... 348/614; 348/726; 348/21; 348/724; 348/608

(58) Field of Classification Search ................ 348/614, 348/21, 607, 554, 553, 608, 723–726, 611, 348/612; 375/277, 262, 264, 265, 341, 295, 375/240.01, 240.12, 240.26, 286, 321; *H04N 5/44*, *H04N 5/21, 5/455, 5/40, 5/213, 5/38*
See application file for complete search history.

(56) References Cited

U.S. PATENT DOCUMENTS 5,087,975 A * 2/1992 Citta et al. .................... 348/21

(Continued)

FOREIGN PATENT DOCUMENTS

KR    2000-0018531 A  *  4/1997

(Continued)

OTHER PUBLICATIONS

U.S. Appl. No. 60/198,014, Bretl et al.*

*Primary Examiner*—Sherrie Hsia
(74) *Attorney, Agent, or Firm*—Lee, Hong, Degerman, Kang & Schmadeka

(57) ABSTRACT

A VSB reception system includes a sequence generator for decoding a symbol corresponding to the supplemental data and generating a predefined sequence included in the supplemental data at VSB transmission system. The reception system also includes a modified legacy VSB receiver for processing the data received from the VSB transmission system in a reverse order of the VSB transmission system by using the sequence, and a demultiplexer for demultiplexing the data from the modified legacy VSB receiver into the MPEG data and the supplemental data. The VSB reception system also includes a supplemental data processor for processing the supplemental data segment from the demultiplexer in a reverse order of the transmission system, to obtain the supplemental data, thereby carrying out the slicer prediction, decoding, and symbol decision more accurately by using the predefined sequence, to improve a performance.

52 Claims, 8 Drawing Sheets

U.S. PATENT DOCUMENTS

| | | | |
|---|---|---|---|
| 5,233,630 A * | 8/1993 | Wolf | 375/308 |
| 5,488,691 A * | 1/1996 | Fuoco et al. | 714/52 |
| 5,555,024 A * | 9/1996 | Limberg | 348/473 |
| 5,563,884 A * | 10/1996 | Fimoff et al. | 370/391 |
| 5,583,889 A * | 12/1996 | Citta et al. | 375/341 |
| 5,600,677 A * | 2/1997 | Citta et al. | 375/296 |
| 5,629,958 A * | 5/1997 | Willming | 375/295 |
| 5,636,251 A * | 6/1997 | Citta et al. | 375/341 |
| 5,636,252 A * | 6/1997 | Patel et al. | 375/345 |
| 5,706,312 A * | 1/1998 | Wei | 375/298 |
| 5,831,690 A * | 11/1998 | Lyons et al. | 375/240.28 |
| 5,923,711 A * | 7/1999 | Willming | 375/287 |
| 5,946,047 A * | 8/1999 | Levan | 348/473 |
| 6,075,569 A * | 6/2000 | Lee et al. | 348/554 |
| 6,208,643 B1 * | 3/2001 | Dieterich et al. | 370/389 |
| 6,490,002 B1 * | 12/2002 | Shintani | 348/569 |
| 6,519,298 B1 * | 2/2003 | Kim | 375/343 |
| 6,690,738 B1 * | 2/2004 | Swenson et al. | 375/265 |
| 6,697,098 B1 * | 2/2004 | Wang | 348/21 |
| 6,708,149 B1 * | 3/2004 | Turin | 704/240 |
| 6,724,832 B1 * | 4/2004 | Hershberger | 375/301 |
| 6,743,025 B2 * | 6/2004 | Howard | 439/35 |
| 6,760,077 B2 * | 7/2004 | Choi et al. | 348/614 |
| 6,788,710 B1 * | 9/2004 | Knutson et al. | 370/535 |
| 2002/0085632 A1 * | 7/2002 | Choi et al. | 375/240.01 |
| 2004/0240590 A1 * | 12/2004 | Cameron et al. | 375/340 |

FOREIGN PATENT DOCUMENTS

KR    2000-0028757 A *    5/2000

* cited by examiner

VSB RECEPTION SYSTEM WITH ENHANCED SIGNAL DETECTION FOR PROCESSING SUPPLEMENTAL DATA

CROSS-REFERENCE TO RELATED APPLICATIONS

This application is a continuation of U.S. application Ser. No. 11/430,445, filed May 8, 2006, now U.S. Pat. No. 7,167,212, which is a continuation of U.S. application Ser, No. 10/791,460, filed Mar. 1, 2004, now U.S. patent No. 7,068,326, issued Jun. 27, 2006, which is a continuation of U.S. application Ser. No. 09/933,206, filed Aug. 20, 2001, now U.S. patent No. 6,760,077, issued Jul. 6, 2004, which pursuant to 35 U.S.C. § 119(a), claims the benefit of earlier filing date and right of priority to Korean Application No. 2001-3304, filed Jan. 19, 2001, the contents of which are hereby incorporated by reference herein in their entirety.

BACKGROUND OF THE INVENTION

1. Field of the Invention

The present intention relates to a digital television reception system, and more particularly, to a 8T-VSB (Vestigial Sideband) reception system resistant to ghost and noise and receiving and decoding supplemental data in addition to MPEG data.

2. Description of the Related Art

The United States of America has employed ATSC 8T-VSB (8 Trellis-Vestigial Sideband) as a standard since 1995, and has been broadcasting in the ATSC 8T-VSB since the later half of 1998. South Korea also has employed the ATSC 8T-VSB as a standard. South Korea started test broadcasting in May 1995, and has since August 2000 put in place a regular test broadcasting system. The advancement of technology allows the transmission of digital television (DTV) in the same 6 MHz bandwidth currently used by NTSC.

FIG. 1 illustrates a block diagram of a conventional ATSC 8T-VSB transmission system 25 ("VSB transmission system"). The VSB transmission system 25 generally comprises a data randomizer 1, Reed-Solomon coder 2, data interleaver 3, Trellis coder 4, multiplexer 5, pilot inserter 6, VSB modulator 7 and RF converter 8.

Referring to FIG. 1, there is a data randomizer 1 for receiving and making random MPEG data (video, audio and ancillary data). The data randomizer 1 receives the MPEG-II data output from an MPEG-II encoder. Although not shown in FIG. 1, the MPEG-II encoder takes baseband digital video and performs bit rate compression using the techniques of discrete cosine transform, run length coding, and bi-directional motion prediction. The MPEG-II encoder then multiplexes this compressed data together with pre-coded audio and any ancillary data that will be transmitted. The result is a stream of compressed MPEG-II data packets with a data frequency of only 19.39 Mbit/Sec. The MPEG-II encoder outputs such data to the data randomizer in serial form. MPEG-II packets are 188 bytes in length with the first byte in each packet always being the sync or header byte. The MPEG-II sync byte is then discarded. The sync byte will ultimately be replaced by the ATSC segment sync in a later stage of processing.

In the VSB transmission system 25, the 8-VSB bit stream should have a random, noise-like signal. The reason being that the transmitted signal frequency response must have a flat noise-like spectrum in order to use the allotted 6 MHz channel space with maximum efficiency. Random data minimizes interference into analog, NTSC. In the data randomizer 1, each byte value is changed according to known pattern of pseudo-random number generation. This process is reversed in the VSB receiver in order to recover the proper data values.

The Reed-Solomon coder 2 of the VSB transmission system 25 is used for subjecting the output data of the data randomizer 1 to Reed-Solomon coding and adding a 20 byte parity code to the output data. Reed Solomon encoding is a type of forward error correction scheme applied to the incoming data stream. Forward error correction is used to correct bit errors that occur during transmission due to signal fades, noise, etc. Various types of techniques may be used as the forward error correction process.

The Reed-Solomon coder 2 takes all 187 bytes of an incoming MPEG-II data packet (the sync or header byte has been removed from 188 bytes) and mathematically manipulates them as a block to create a digital sketch of the block contents. This "sketch" occupies 20 additional bytes which are added at the tail end of the original 187 byte packet. These 20 bytes are known as Reed-Solomon parity bytes. The 20 Reed-Solomon parity bytes for every data packet add redundancy for forward error correction of up to 10 byte errors/packet. Since Reed-Solomon decoders correct byte errors, and bytes can have anywhere from 1 to 8 bit errors within them, a significant amount of error correction can be accomplished in the VSB reception system. The output of the Reed-Solomon coder 2 is 207 bytes (187 plus 20 parity bytes).

The VSB reception system will compare the received 187 byte block to the 20 parity bytes in order to determine the validity of the recovered data. If errors are detected, the receiver can use the parity bytes to locate the exact location of the errors, modify the corrupted bytes, and reconstruct the original information.

The data interleaver 3 interleaves the output data of the Reed-Solomon coder 2. In particular, the data interleaver 3 mixes the sequential order of the data packet and disperses or delays the MPEG-II packet throughout time. The data interleaver 3 then reassembles new data packets incorporating small sections from many different MPEG-II (pre-interleaved) packets. The reassembled packets are 207 bytes each.

The purpose of the data interleaver 3 is to prevent losing of one or more packets due to noise or other harmful transmission environment. By interleaving data into many different packets, even if one packet is completely lost, the original packet may be substantially recovered from information contained in other packets.

The VSB transmission system 25 also has a trellis coder 4 for converting the output data of the data interleaver 3 from byte form into symbol form and for subjecting it to trellis coding. In the trellis coder 4, bytes from the data interleaver 3 are converted into symbols and provided one by one to a plurality of Trellis coders and precoders 32-1 to 32-12, shown in FIG. 7.

Trellis coding is another form of forward error correction. Unlike Reed-Solomon coding, which treated the entire MPEG-II packet simultaneously as a block, trellis coding is an evolving code that tracks the progressing stream of bits as it develops through time.

The trellis coder 4 adds additional redundancy to the signal in the form of more (than four data levels, creating the multilevel (8) data symbols for transmission. For trellis coding, each 8-bit byte is split up into a stream of four, 2-bit words. In the trellis coder 4, each 2-bit input word is compared to the past history of previous 2-bit words. A 3-bit binary code is mathematically generated to describe the transition from the previous 2-bit word to the current one. These 3-bit codes are substituted for the original 2-bit words and transmitted as the eight level symbols of 8-VSB. For every two bits that enter the trellis coder 4, three bits come out.

The trellis decoder in the VSB receiver uses the received 3-bit transition codes to reconstruct the evolution of the data stream from one 2-bit word to the next. In this way, the trellis coder follows a "trail" as the signal moves from one word to the next through time. The power of trellis coding lies in its ability to track a signal's history through time and discard potentially faulty information (errors) based on a signal's past and future behavior.

A multiplexer 5 is used for multiplexing a symbol stream from the trellis coder 4 and synchronizing signals. The segment and the field synchronizing signals provide information to the VSB receiver to accurately locate and demodulate the transmitted RF signal. The segment and the field synchronizing signals are inserted after the randomization and error coding stages so as not to destroy the fixed time and amplitude relationships that these signals must possess to be effective. The multiplexer 5 provides the output from the trellis coder 4 and the segment and the field synchronizing signals in a time division manner.

An output packet of the data interleaver 3 comprises the 207 bytes of an interleaved data packet. After trellis coding, the 207 byte segment is stretched out into a baseband stream of 828 eight level symbols. The segment synchronizing signal is a four symbol pulse that is added to the front of each data segment and replaces the missing first byte (packet sync byte) of the original MPEG-II data packet. The segment synchronizing signal appears once every 832 symbols and always takes the form of a positive-negative-positive pulse swinging between the +5 and −5 signal levels.

The field synchronizing signal is an entire data segment that is repeated once per field. The field synchronizing signal has a known data symbol pattern of positive-negative pulses and is used by the receiver to eliminate signal ghosts caused by poor reception.

The VSB transmission system 25 also has the pilot inserter 6 for inserting pilot signals into the symbol stream from the multiplexer 5. Similar to the synchronizing signals described above, the pilot signal is inserted after the randomization and error coding stages so as not to destroy the fixed time and amplitude relationships that these signals must possess to be effective.

Before the data is modulated, a small DC shift is applied to the 8T-VSB baseband signal. This causes a small residual carrier to appear at the zero frequency point of the resulting modulated spectrum. This is the pilot signal provided by the pilot inserter 6. This gives the RF PLL circuits in the VSB receiver something to lock onto that is independent of the data being transmitted.

After the pilot signal has been inserted by the pilot inserter 6, the output is subjected to a VSB modulator 7. The VSB modulator 7 modulates the symbol stream from the pilot inserter 6 into an 8 VSB signal of an intermediate frequency band. The VSB modulator 7 provides a filtered (root-raised cosine) IF signal at a standard frequency (44 Mhz in the U.S.), with most of one sideband removed.

In particular, the eight level baseband signal is amplitude modulated onto an intermediate frequency (IF) carrier. The modulation produces a double sideband IF spectrum about the carrier frequency. The total spectrum is too wide to be transmitted in the assigned 6 MHz channel.

The sidelobes produced by the modulation are simply scaled copies of the center spectrum, and the entire lower sideband is a mirror image of the upper sideband. Therefore using a filter, the VSB modulator discards the entire lower sideband and all of the sidelobes in the upper sideband. The remaining signal (upper half of the center spectrum) is further eliminated in one-half by using the Nyquist filter. The Nyquist filter is based on the Nyquist Theory, which summarizes that only a ½ frequency bandwidth is required to transmit a digital signal at a given sampling rate.

Finally, there is a RF (Radio Frequency) converter 8 for converting the signal of an intermediate frequency band from the VSB modulator 7 into a signal of a RF band signal, and for transmitting the signal to a reception system through an antenna 9.

The foregoing VSB communication system is at least partially described in U.S. Pat. Nos. 5,636,251, 5,629,958 and 5,600,677 by Zenith Co. which are incorporated herein by reference. The 8T-VSB transmission system, which is employed as the standard digital TV broadcasting in North America and South Korea, was developed for the transmission of MPEG video and audio data. As technologies for processing digital signals develop and the use of the Internet increases, the trend currently is to integrate digitized home appliances, the personal computer, and the Internet into one comprehensive system.

FIG. 2 illustrates a related art ATSC 8T-VSB reception system 150 ("VSB reception system"). In FIG. 2, there is a demodulator 11 for receiving a RF band signal through an antenna 10 and converting the RF band signal into a base band signal, a synchronizing and timing recovery (not shown) for recovering a segment synchronizing signal, a field synchronizing signal and symbol timing.

There is a comb filter 12 for removing an NTSC interference signal, and a channel equalizer 13 for correction of a distorted channel by using a slicer predictor 14. A phase tracker 15 is provided for correcting a phase of a received signal, and a Trellis decoder 16 for subjecting the phase corrected signal to Viterbi decoding. There is a data deinterleaver 17 for carrying out a reverse action of the data interleaver 3 in the transmission system, and a Reed-Solomon decoder 18 for decoding the Reed-Solomon coded signal.

The VSB reception system 150 further includes a a data derandomizer 19 for making a reverse action of the data randomizer 1 in the transmission system. Thus, the VSB reception system 150 can receive only the MPEG data, and no supplemental data. Accordingly, the development of a reception system that can receive the supplemental data as well as the MPEG video and audio data is needed. Moreover, the prediction reliability of the slicer predictor 14 in the VSB reception system 150, which predicts a signal level group, degrades in the presence of excessive channel noise or an excessive ghost.

SUMMARY OF THE INVENTION

Accordingly, the present invention is directed to a VSB reception system that substantially obviates one or more of the problems due to limitations and disadvantages of the related art.

An object of the present invention is to provide a digital VSB reception system which can receive both MPEG data and supplemental data.

Another object of the present invention is to provide a digital VSB reception system which has significantly improved performance over channel noise and ghost than the related art ATSC 8T-VSB reception system.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a VSB reception system for receiving and decoding an input signal (comprising an MPEG data segment and a supplemental data segment) transmitted from a VSB transmission system comprises a sequence generator for indicating a symbol corresponding to the supplemental data and generating a predefined sequence encoded with the supplemental data; a modified legacy VSB receiver for processing the input signal received from the VSB transmission system in a reverse order of the VSB transmission system and outputting a derandomized data signal; a demultiplexer for demultiplexing the derandomized data signal from the modified legacy VSB receiver into the MPEG data segment and an encoded supplemental data segment; and a supplemental data processor for decoding the encoded supplemental data segment from the demultiplexer to obtain the supplemental data segment.

According to one aspect of the present invention, the sequence generator includes a multiplexer for receiving and multiplexing a supplemental data dummy packet and an MPEG data dummy packet; a randomizer for randomizing an output signal of the multiplexer; a parity inserter for inserting dummy bytes to randomized data; a data interleaver for interleaving an output of the parity inserter; and a trellis coder for converting interleaved data to symbols and outputting the converted symbols without subjecting to trellis coding. Preferably, the trellis coder includes a plurality of coders and precoders for receiving the symbols and forwarding the symbols without subjecting to precoding and coding. The randomizer subjects the output signal of the multiplexer using pseudo random bytes and 0×55 to a bit-wise AND logical operation, and a result of the AND logical operation and input bits from the multiplexer to a bit-wise exclusive OR logical operation.

According to another aspect of the present invention, the symbols from the trellis coder includes two bits D1 and D0, wherein if the bit D1 is at a first logic level, a symbol corresponds to a supplemental data symbol, and if the bit D1 is at a second logic level, the symbol is an MPEG data symbol, and when the bit D1 is at the first logic level, the bit D0 is the predefined sequence being used to decode the supplemental data segment.

According to another aspect of the present invention, the dummy bytes correspond to the 20 parity bytes are dummy bytes of 0×00, and the MPEG data dummy packet produces 187 dummy bytes of 0×00, and the supplemental data dummy packet produces three dummy bytes of 0×00 corresponding to the MPEG header bytes, and 184 dummy bytes of 0×AA corresponding to the supplemental data packet.

According to another aspect of the present invention, the modified legacy VSB receiver includes a demodulator for receiving the input signal through and converting the input signal into a base band signal, and recovering a segment synchronizing signal, a field synchronizing signal, and a symbol timing from the base band signal; a comb filter for removing an NTSC interference signal from an output signal of the demodulator, if the NTSC interference signal is detected; a slicer predictor for providing a slicer prediction signal and a prediction reliability signal by using a predefined sequence from the sequence generator; a channel equalizer for correcting a distorted channel in an output signal of the comb filter by using the slicer prediction signal, the prediction reliability signal and the predefined sequence and outputting a channel equalizer output signal; a phase tracker for correcting a phase of an output signal of the channel equalizer by using the predetermined sequence and the slicer prediction signal from a trellis decoder; a trellis decoder for decoding an output of the phase tracketer using Viterbi algorithm and the predefined sequence received from the sequence generator; a data deinterleaver for deinterleaving a trellis decoder output signal; a Reed-Solomon decoder for decoding a Reed-Solomon coded signal outputted from the data deinterleaver; and a data derandomizer for derandomizing a Reed-Solomon decoder output signal.

According to another aspect of the present invention, the supplemental data processor includes an MPEG header remover for removing three MPEG header bytes from the supplemental data segment received from the demultiplexer; a null sequence remover for removing the null sequence inserted to the supplemental data packet; and a Reed-Solomon decoder for subjecting a null sequence remover output to Reed-Solomon decoding. There may be provided, a deinterleaver between the null sequence remover and the Reed-Solomon decoder for deinterleaving the null sequence remover output.

According to another aspect of the present invention, the channel equalizer includes a plurality of slicers each having a predetermined signal level detector; a feed-forward filter for receiving a comb filter output signal; a feedback filter for receiving an output signal of one of the plurality of slicers; an adder for adding output signals of the feed-forward filter and the feedback filter and outputting an added signal as a channel equalizer output signal, wherein the plurality of slicers commonly receive the added signal; a multiplexer for outputting one of the outputs of the plurality of slicers to the feedback filter in response to a control signal; and a controller for updating filter coefficients of the feed-forward filter and the feedback filter and providing the control signal to the multiplexer in response to a multiplexer output signal, the slicer prediction signal, and the prediction reliability signal, the channel equalizer output signal and the predefined sequence to select the multiplexer to output signal from one of the plurality of slicers that has the predetermined signal level detector closes to the comb filter output signal.

According to another aspect of the present invention, the slicer predictor receives the channel equalizer output signal, the predefined sequence generated from the sequence generator and information that the symbol received is of the supplemental data packet, estimates a register value of the trellis coder, calculates prediction reliability, and forwards the estimated register value and the prediction reliability signal to the controller of the channel equalizer.

According to another aspect of the present invention, the plurality of slicers includes first to third slicers for processing MPEG data symbols, and fourth to ninth slicers for processing the supplemental data symbols. The first slicer has 8 level values of −7, −5, −3, −1, +1, +3, +5, +7, the second slicer has 4 level values of −7, −3, +1, +5, the third slicer has 4 level values of −5, −1, +3, +7, the fourth slicer has 4 level values of −7, −5 +1+, +3, the fifth slicer has 4 level values of −3, −1, +5, +7, the sixth slicer has 2 level values of −7, +1, the seventh slicer has 2 level values of −5, +3, the eighth slicer has 2 level values of −3, +5, and the ninth slicer has 2 level values of −1, +7. Preferably, −7 denotes 000, −5 denotes 001, −3 denotes 010, −1 denotes 011, +1 denotes 100, +3 denotes 101, +5 denotes 110, and +7 denotes 111.

According to another aspect of the present invention, with respect to the MPEG data symbols, the first slicer is selected in a low reliability case, the second slicer is selected for a high reliability case and the estimated register value is at a first logic level, and the third slicer is selected for a high reliability case and estimated register value is at a second logic level.

According to another aspect of the present invention, with respect to the supplemental data symbols one of the fourth slicer and the fifth slicer is selected in response to the predefined sequence for a low reliability case; the sixth slicer is selected for a high reliability case and the predefined sequence value and the estimated register value are at a first logic level; the seventh slicer is selected for a high reliability case and the predefined sequence value is at a first logic level and the estimated register value is at a second logic level; the eighth slicer is selected for a high reliability case and the predefined sequence value is at a second logic level and the estimated register value is at a first logic level; and the ninth slicer is selected for a high reliability case and the predefined sequence value and the estimated register value are at a second logic level.

It is to be understood that both the foregoing general description and the following detailed description are exemplary and explanatory and are intended to provide further explanation of the invention as claimed.

BRIEF DESCRIPTION OF TEE DRAWINGS

The accompanying drawings, which are included to provide a further understanding of the invention and are incorporated in and constitute a part of this specification, illustrate embodiments of the invention and, together with the description, serve to explain the principles of the invention.

FIG. 8 illustrates a block diagram of a VSB reception system in accordance with a preferred embodiment of the present invention;

DETAILED DESCRIPTION OF THE PREFERRED EMBODIMENTS

Reference will now be made in detail to the preferred embodiments of the present invention, examples of which are illustrated in the accompanying drawings.

Figure 3:
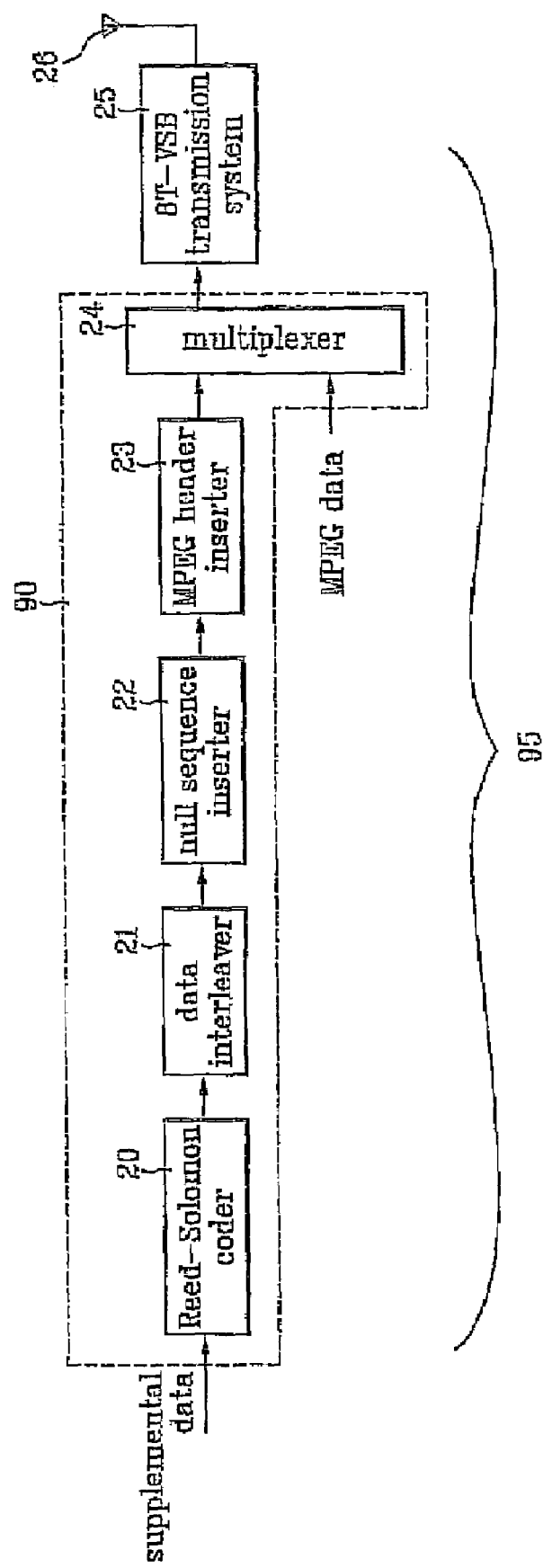
FIG. 3 illustrates a block diagram of a VSB transmission system for digital TV broadcasting in accordance with a preferred embodiment of the present invention.

FIG. 3 illustrates a block diagram showing a VSB transmitter 95 for the transmission of the supplemental and MPEG data in accordance with a preferred embodiment of the present invention. In FIG. 3, the VSB transmitter 95 includes a VSB supplemental data processor 90 and a VSB transmission system 25. The description of the VSB transmission system 25 is described above in connection with FIG. 1, and thus, will not be repeated. According to the preferred embodiment of the present invention, the VSB supplemental data processor 90 includes a Reed-Solomon coder 20, a data interleaver 21, a null sequence inserter 22, an MPEG header inserter 23, a multiplexer 24, an 8T-VSB transmission system 25, and an antenna 26.

As shown in FIG. 3, for the transmission of the supplemental data from the VSB transmitter 95 (i.e., a broadcasting station) to a VSB reception system on a channel (terrestrial or cable), the VSB transmitter 95 subjects the supplemental data to various digital signal processes. To provide backward compatibility of the present invention with existing devices, the supplemental data is preferably 164 byte packet which will eventually be processed to be a 187 byte packet before entering the VSB transmission system 25. However, the size of the supplemental data packet may be varied so long as the output of the VSB supplemental data processor 90 is compatible with the VSB transmission system 25.

In the VSB supplemental data processor 90, there is provided a Reed-Solomon coder 20 for the correction of errors. The supplemental data is coded at a Reed-Solomon coder (or R-S coder) 20. Preferably, the Reed-Solomon coder 20 is used for subjecting the supplemental data to Reed-Solomon coding and adding a 20 byte parity code to the output data. As described above, Reed Solomon encoding is a type of forward error correction scheme applied to the incoming data stream. Forward error correction is used to correct bit errors that occur during transmission due to signal fades, noise, etc. Various other types of error correction techniques known to one of ordinary skill in the art may be used as the forward error correction process.

According to the preferred embodiment, the Reed-Solomon coder 20 of the VSB supplemental data processor takes 164 bytes of an incoming supplemental data packet and mathematically manipulates them as a block to create a digital sketch of the block contents. The 20 additional bytes are added at the tail end of the original 164 byte packet. These 20 bytes are known as Reed-Solomon parity bytes. Since Reed-Solomon decoders of the VSB reception system correct byte errors, and bytes can have anywhere from 1 to 8 bit errors within them, a significant amount of error correction can be accomplished in the VSB reception system. The output of the Reed-Solomon coder 20 is preferably 184 bytes (164 bytes from the original packet plus 20 parity bytes).

The VSB supplemental data processor 90 further includes the data interleaver 21, which interleaves the output data of the Reed-Solomon coder 20. The data interleaver 21 is for interleaving the coded supplemental data to enhance performance against burst noise. The data interleaver 21 may be omitted, if it is not required to enhance the burst noise performance of supplements data.

The data interleaver 21 according to the preferred embodiment mixes the sequential order of the supplemental data packet and disperses or delays the supplemental data packet throughout time. The data interleaver 21 then reassembles new data packets incorporating small sections from many different supplemental data packets. Each one of the reassembled packets are preferably 184 bytes long.

As described above, the purpose of the data interleaver 21 is to prevent losing of one or more packets due to noise or other harmful transmission environment. By interleaving data into many different packets, even if one packet is completely lost, the original packet may be recovered from information contained in other packets. However, because there is a data interleaver in the ATSC 8T-VSB transmission system, the data interleaver for the supplemental data can be omitted if it is not required to enhance the burst noise performance of the supplemental data. For this reason, the data interleaver 21 may not be necessary for the VSB supplemental data processor 90.

Figure 1:
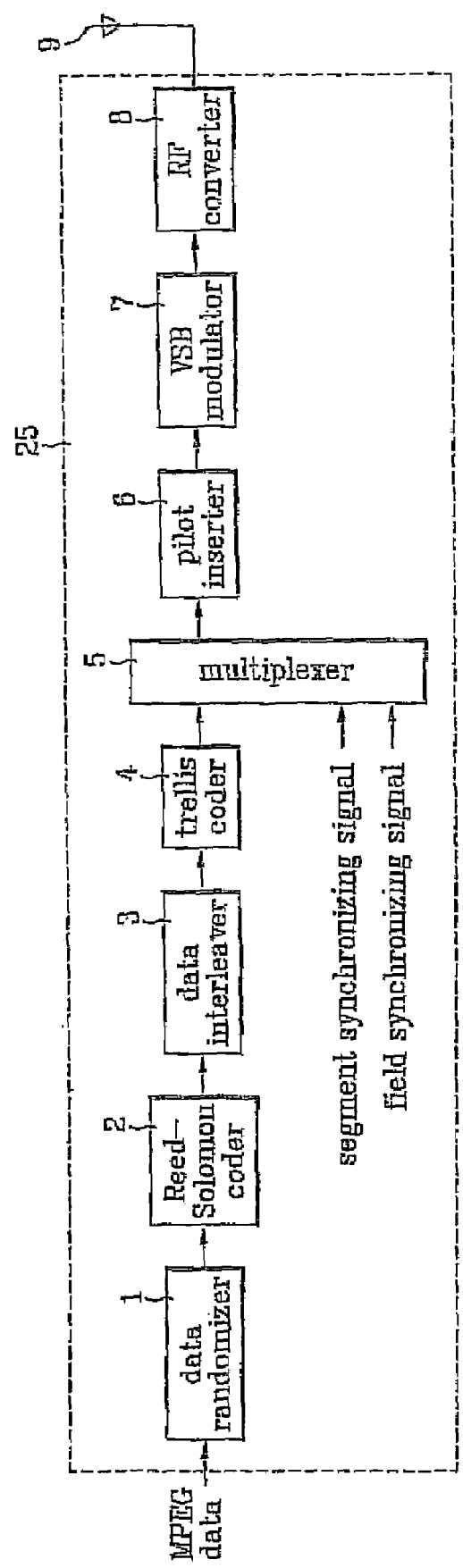
FIG. 1 illustrates a block diagram showing an ATSC 8T-VSB transmission system.

The VSB supplemental data processor 90 also includes the null sequence inserter 22 for inserting a null sequence to an allocated region of the interleaved (if the data interleaver 21 was present) or Reed-Solomon coded supplemental data for generating the predefined sequence for the supplemental data at an input terminal of a Trellis coder (shown in FIG. 1). The null sequence is inserted so that the VSB reception system receives the supplemental data reliably, even in a noisy channel or multipath fading channel. An example structure of the transmission data formed by the insertion of the null sequence will be explained below in detail with reference to FIG. 4.

Further referring to FIG. 3, the VSB supplemental data processor 90 includes the MPEG header inserter 23 for adding an MPEG header to the supplemental data having the null sequence inserted thereto, for backward-compatibility with the legacy VSB reception system. Because the MPEG-II data supplied to the VSB transmission system 25 is 187 bytes long, the MPEG header inserter 23 places, preferably, three headers in front of each packet (which was 184 bytes) to form a 187 byte long packet identical to the MPEG-II data packet.

The supplemental data having the MPEG header added thereto is provided to a multiplexer 24. The multiplexer 24 receives as inputs the processed supplemental data from the MPEG header inserter 23 and MPEG data packets. MPEG data packet, such as a broadcasting program (movie, sports, entertainment, or drama), coded through a different signal path (output from MPEG encoder), is received together with the supplemental data at the multiplexer 24. Upon reception of the MPEG data and the supplemental data, the multiplexer 24 multiplexes the supplemental data and the MPEG data at a fixed ratio under the control of a controller defining a multiplexing ratio and unit and forwards the multiplexed data to the 8T-VSB transmission system 25.

The VSB transmission system 25, which is described in detail in reference to FIG. 1, processes the multiplexed data and transmits the processed data to the VSB reception system through the antenna 26.

For example, the Reed-Solomon coder 20 uses a code having a block size N=184, a payload K=164, and an error correction capability T=10. On the other hand, as a generator polynomial of the Galois Field and the Reed-Solomon coder 20, the same code as the Reed-Solomon coder 2 described with respect to FIG. 1 may be used. According to the preferred embodiment, other values of the block size N, the payload K, and the error correction capability T may be used in the Reed-Solomon coder 20 in FIG. 3. For an example, a code having N=184, K=154, and T=15 may be used, or a code having N=92, K=82, and T=5 may be used. Although the Reed-Solomon code is used in the present invention, other code suitable for error correction known to one of ordinary skill in the art may be used therein.

In the VSB transmission system 25, one data field has 313 segments: 312 data segments 124 and one field synchronizing segment 122. The 312 data segments have data segments of the supplemental data and the MPEG data segments. Each data segment has 184 byte data, a 3 byte MPEG header, and the 20 byte Reed-Solomon parity. The 3 byte MPEG header will be used by the MPEG decoder in the VSB reception system.

The use of the MPEG header is explained in more detail. ISO/IEC 13818-1 has a definition on an MPEG transport packet header. If a 0×47 synchronization byte is removed from the MPEG transport packet header, a 3 byte header is left. A PID (program identification) is defined by this 3 bytes. A transport part of the MPEG decoder discards a packet if the PID of the received packet received is not valid. For example, a null packet PID or other received PID can be used. Therefore, the MPEG header inserter 14 in FIG. 2 inserts the 3 byte header containing such a PID into the supplemental data packet. Therefore, the supplemental data can be discarded at the MPEG decoder of the legacy VSB receiver.

The VSB reception system determines the multiplexing locations of the MPEG data and the supplemental data in the field data received synchronous to the field synchronizing signal. The VSB reception system demultiplexes the MPEG data and the supplemental data based on the multiplexing locations. A multiplexing ratio and method for multiplexing the MPEG data and the supplemental data may vary with amounts of data thereof.

Information on the variable multiplexing method and ratio may be loaded, for example, on a reserved area of the 92 bits not used in the field synchronizing signal. By retrieving and decoding such information, the VSB reception system identifies the correct multiplexing ratio and method from the multiplexing information contained in the field synchronizing signal.

Alternatively, the multiplexing information may be inserted, not only in the reserved area of the field synchronizing signal, but also in the data segment of the supplemental data. One of the supplement data segment may be used to transit the multiplexing information for use by the VSB reception system.

Figure 4:
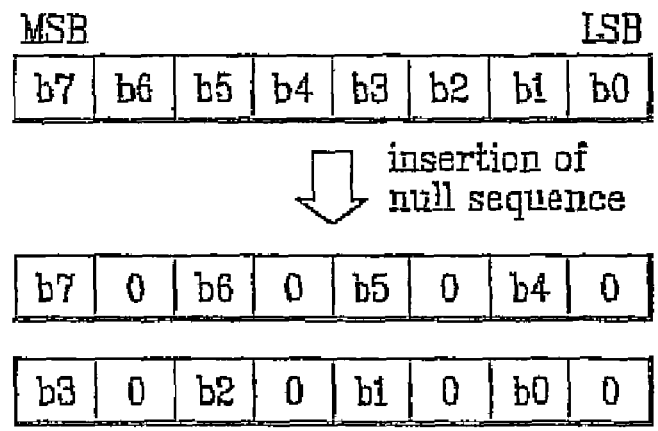
FIG. 4 illustrates a diagram for explaining insertion of a null sequence.

FIG. 4 illustrates a diagram for explaining the process for inserting a null sequence into the supplemental data at the null sequence inserter 22 in FIG. 3 to generate the predefined sequence at the input of the trellis coder.

The VSB transmission system inserts the predefined sequence into the supplemental data before transmission for performance enhancement of the VSB reception system. The sequence has a series of '1's and '0's arranged in an order fixed in advance. The numbers of '1' and '0' are required to be the same in average. For example, the predefined sequence may be an output of a pseudo random sequence generator whose initial value is fixed in advance. As shown in FIG. 4, upon reception of one bit of supplemental data, the null sequence inserter 22 inserts one null bit therein, to provide 2 bits. The null bit is randomized in the 8T-VSB transmission system in FIG. 3, and then subjected to Reed-Solomon coding. The coded supplemental data is interleaved, and applied to a Trellis coder (not shown) as an input d0. The input signal d0 is a low order bit of the two bits applied to the Trellis coder.

FIG. 4 illustrates an example of inserting the null sequence into the supplemental data by the null sequence inserter 22 according to the preferred embodiment of the present invention. The supplemental data having the null sequence inserted therein is transmitted to the VSB reception system. The predefined sequence has 1's and 0's arranged in a fixed order. The predefined sequence inserted in the supplemental data can be used for performance improvement in the reception system.

For example, the channel equalizer of the VSB reception system uses the sequence to enhance ghost cancellation performance of both the supplemental data and the MPEG data and the Trellis decoder uses the sequence to improve noise performance of supplemental data. As shown in FIG. 4, upon reception of one supplemental data byte, the null sequence inserter 22 for generating the predefined sequence inserts null bits, to provide two bytes.

The inserted null sequence is processed in the VSB transmission system 25 in FIG. 3, and then transmitted to the VSB reception system. The null sequence is randomized by the data randomizer 1 of the VSB transmission system 25, and coded by the Reed-Solomon coder 2. Then, the null sequence is interleaved by the data interleaver 3, and provided to the Trellis coder 4 as an input signal D0. This converted sequence is the predefined sequence. The input signal D0 is a lower bit of the two input bits to the Trellis coder 4. The Trellis coder is basically operative such that three bits are provided with two received bits.

The VSB reception system generates the sequence received as the input signal D0 from the Trellis coder in the 8T-VSB transmission system 25, i.e., the predefined sequence, and uses the generated sequence for improving the performance of the VSB reception system. Alternatively, other sequences known to one of ordinary skill in the art may be used instead of the null sequence described above.

The VSB transmitter 95 of the present invention is required to have substantially identical probabilities of occurrence of the 8 levels, for having backward-compatibility with the related art VSB transmission system. Therefore, the presence of the 0's and 1's in the sequence received as the input signal D0 at the Trellis coder are required to be almost the same.

Figure 5:
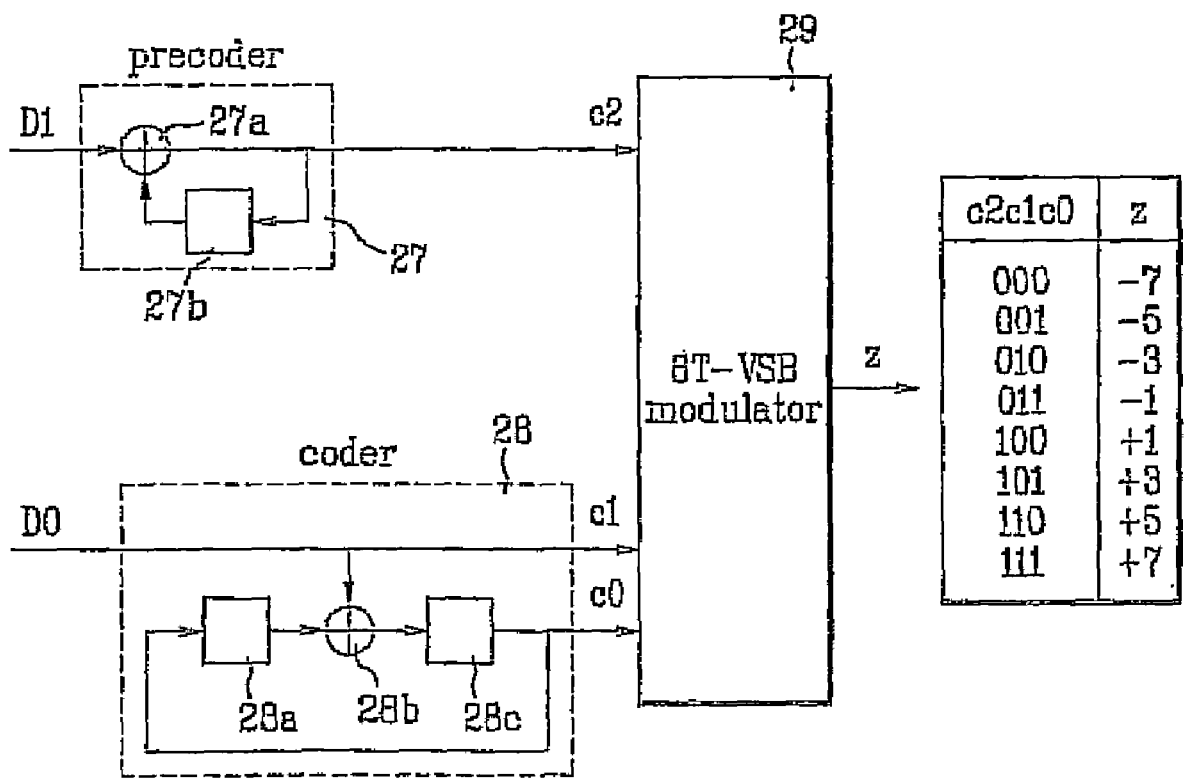
FIG. 5 illustrates a block diagram of a Trellis coder and a precoder.
Figure 6:
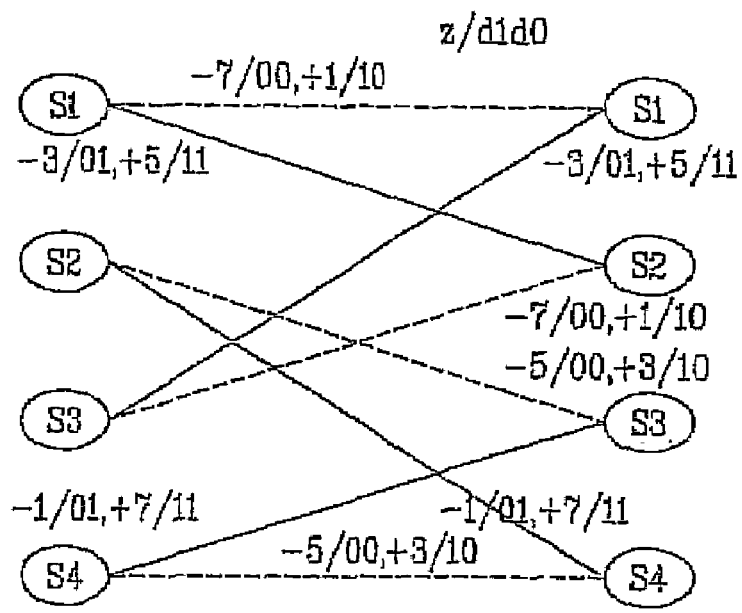
FIG. 6 illustrates a state transition diagram of an ATSC 8T-VSB Trellis coder.

FIG. 5 illustrates a block diagram of the components of the trellis coder 4 used in the VSB transmission system 25 in FIG. 3. FIG. 6 illustrates state transition diagrams of the Trellis coder shown in FIG. 5. The trellis coder 4 comprises a coder 28, a precoder 27 and a modulator 29.

In FIG. 5, the Trellis coder 28 and the precoder 27 receive two input bits D0 and D1 and provide three output bits C0, C1, and C2. An 8T-VSB modulator 29 provides modulated values 'z' of the three output bits C0, C1, and C2. In FIG. 5, reference numerals 27a and 28b denote adders, and 27b, 28a, and 28c denote registers.

As shown in FIG. 5, the input bit D1 is precoded into the output bit C2 by the precoder 27. The input bit D0 is the same as the output bit C1. The output bit C0 is a value stored in the register 28c of the Trellis coder 28. Signal levels are determined by an output bitstream C0, C1, and C2 of the Trellis coder 28 and the precoder 27, wherein there are 8 whole signal levels (−7, −5, −3, −1, +1, +3, +5, +7). The whole signal levels are divided into two groups of signal levels (−7, −3, +1, +5) (−5, −1, +3, +7) each with 4 levels according to the output bit C0. In other words, one out of the two groups of signal levels (−7, −3, +1, +5) (−5, −1, +3, +7) each with 4 levels are selected according to the value stored in the register 28c.

Therefore, if the estimation of the present value stored in the register 28c in the coder 28 is possible, prediction of an output signal level of the coder 28 falling on one of the two signal level groups is possible. In other words, to estimate the present value of the register 28c in coder 28 means to predict one of the two signal level group in which the next output signal of the coder 28 rill fall on. As a result, a for level slicer having two times the distance between each signal level can be used instead of a conventional 8 level slicer with reduced signal level separations.

In order to estimate the value stored in the register 28c of the coder 28, the Viterbi algorithm is preferably used for the Trellis decoder 52 of the VSB reception system 100 (shown in FIG. 8). If a wrong prediction is made on the signal level groups, the prediction error can be higher. Therefore, for minimizing the prediction error, the conventional 8T-VSB reception system 150 (shown in FIG. 2) uses the four level slicer if the prediction reliability is high, and/or uses an original 8 slicer if the prediction reliability is low.

The present invention improves the prediction reliability significantly by using the predefined sequence transmitted from the VSB transmission system. Preferably, both the slicer predictor and the Trellis decoder used in the VSB reception system use the Viterbi algorithm.

The Viterbi algorithm estimates one of state transitions (or paths) that has the highest probability with respect to time. As expressed in equation (1), the probability that a state value of the Trellis coder 28 is 'Si' at a time 'k' is proportional to a cumulative metric Mi of the state value Si.

$$P(Si) \propto e^{-Mi} \qquad (1)$$

A cumulative metric up to the time 'k' can be expressed as equation (2), where 'yj' denotes a received 8T-VSB signal value, and 'xj' denotes a level value of the 8T-VSB signal assigned to a branch connecting between states in the state transition drawing of FIG. 6.

$$Mi = \sum_{j=1}^{k} (yj - xj)^2 \qquad (2)$$

As shown in the state transition diagram of FIG. 6, since the input bit to the Trellis coder 28 has two bits, the number of branches connecting the states is four. Of the four paths connecting respective states S1, S2, S3, and S4, the Viterbi algorithm selects and stores a path having the least cumulative metric value. A part that carries out such a process is called an ACS (Accumulate/Compare/Select) module. By selecting a metric having the smallest value from the metrics selected and stored in the respective states S1, S2, S3, and S4, a state of the highest probability at the time 'k' can be selected.

In the VSB transmitter 95 for digital TV broadcasting shown in FIG. 3, the null sequence is inserted in the supplemental data, and the predefined sequence is transmitted to the VSB reception system through the bit D0 received at the Trellis coder. Preferably, the use of the predefined sequence at the VSB reception system may significantly improve performance of the Viterbi algorithm.

For example, the case when the bit of the predefined sequence transmitted from the transmission system at the time 'k' is '1' will be discussed. In this case, it is impossible that the branches having D1 and D0 being 00 and 10 among the four branches connecting the states S1, S2, S3, and S4 are selected to be the path of the highest probability.

The case when a bit D1 of the predefined sequence is '0' will be discussed. In this case, it is impossible that the branches having D1 and D0 being 01 and 11 among the four branches connecting the states S1, S2, S3, and S4 are selected to be the path of the highest probability. At the end, the use of the predefined sequence permits the ACS module to reduce the number of branches from four to two by using the Viterbi algorithm. As a result, the performance of the Trellis decoder and the reliability of the slider predictor in the reception system is significantly improved.

Figure 2:
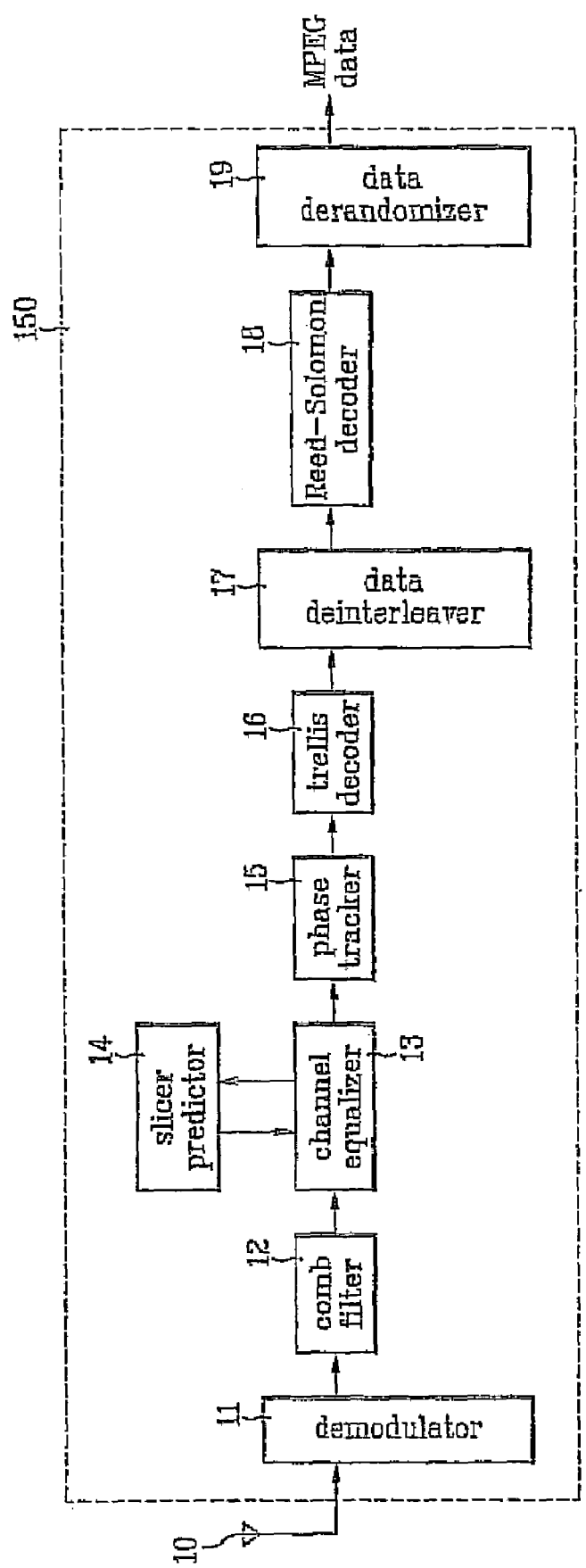
FIG. 2 illustrates a block diagram showing an ATSC 8T-VSB reception system.

In the ATSC 8T-VSB reception system 150 in FIG. 2, the channel equalizer 13 and the phase tracker 15 use a slicer and a slicer predictor 14, respectively. In general, the slicer predictor 14 in the phase tracker is included in the Trellis decoder 16.

Figure 7:
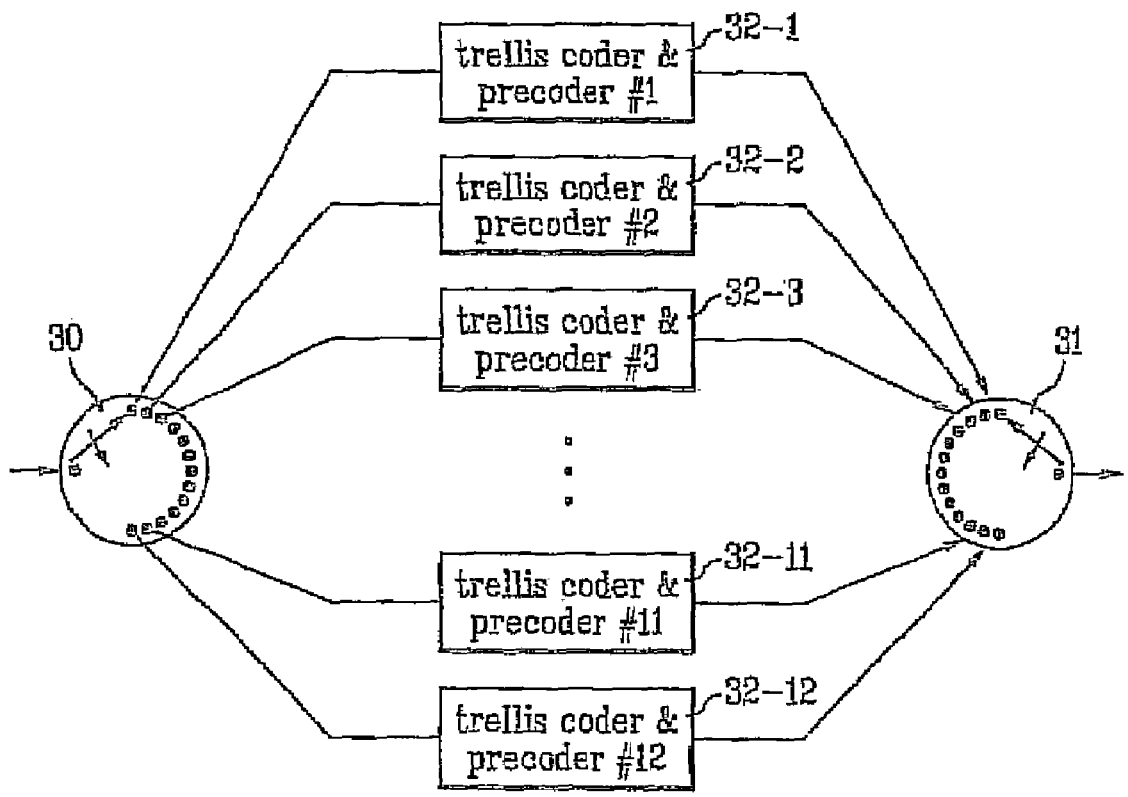
FIG. 7 illustrates a functional diagram of an ATSC 8T-VSB Trellis coder.
Figure 6:
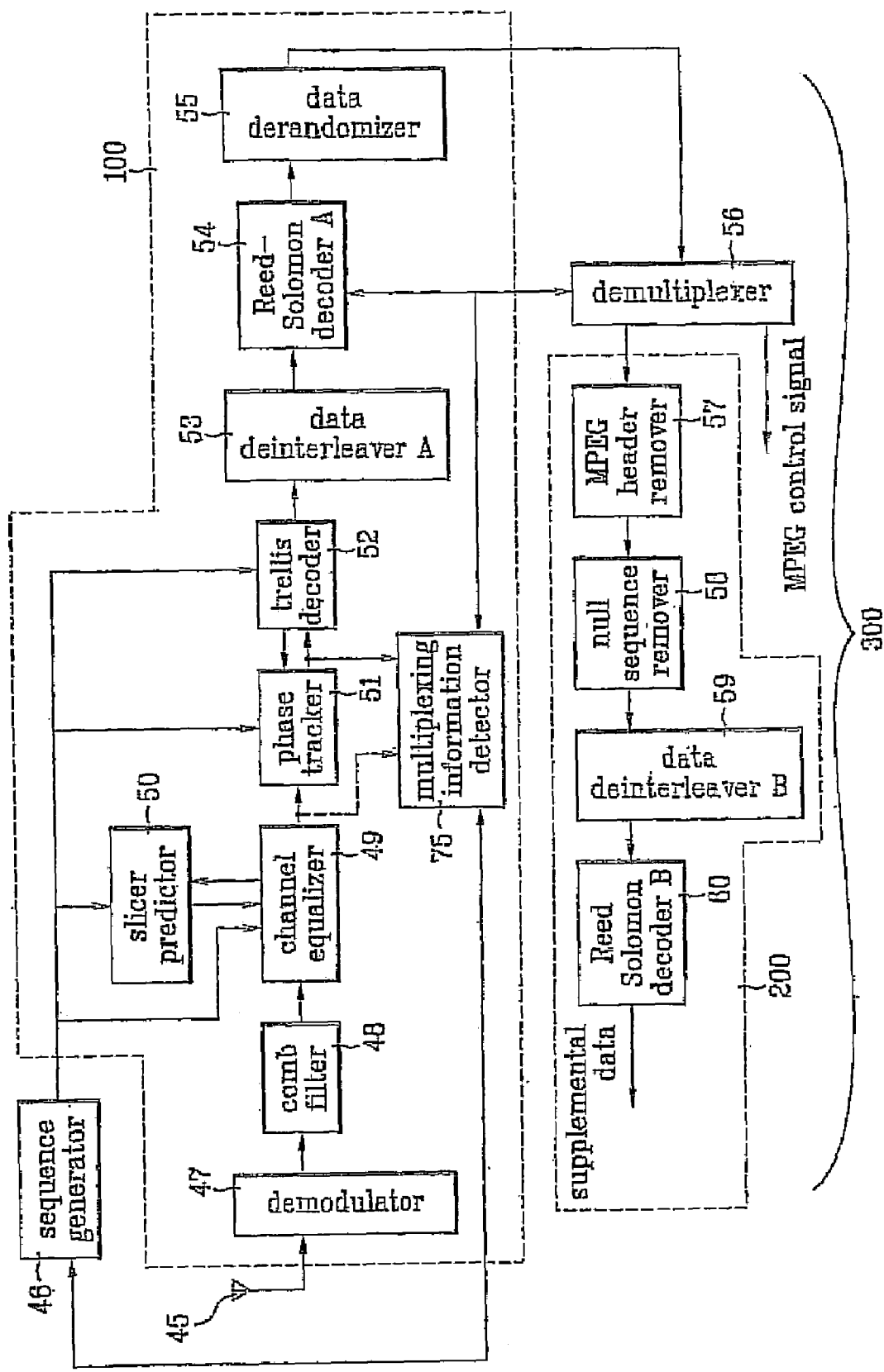

FIG. 7 illustrates a diagram of an ATSC 8T-VSB Trellis coder 4 included in the VSB transmission system 25 in FIG. 3. The VSB Trellis coder 4 includes, for example, the 12 Trellis coder and precoders 32-1 to 32-12, a multiplexer 30 having output terminals connected to input terminals of the Trellis coder and precoders 32-1 to 32-12, and a multiplexer 31 having an output terminals connected to output terminals of the Trellis coder and precoders 32-1 to 32-12.

FIG. 8 illustrates a block diagram of a digital VSB reception system 300 in accordance with a preferred embodiment of the present invention, which improves reception performance by using a predefined sequence and receives supplemental data transmitted by the VSB transmitter.

In FIG. 8, the VSB reception system 300 of the present invention includes a sequence generator 46 for indicating a symbol of the supplemental data and generating a predefined sequence included in the supplemental data, a modified legacy VSB receiver 100 for processing the data received from the VSB transmitter 95 (shown in FIG. 3) in a reverse order of the VSB transmission system. The VSB reception system 300 further includes a demultiplexer 56 for demultiplexing the data from the modified legacy VSB receiver 100 into the MPEG data (also known as data segment) and the supplemental data (also known as data segment), and a supplemental data processor 200 for processing the supplemental data segment from the demultiplexer 56 in reverse order of the transmission system, to obtain the original supplemental data.

As shown in FIG. 8, the modified legacy VSB receiver 100 includes a demodulator 47, a comb filter 48, a channel equalizer 49, a slicer predictor 50, a phase tracker 51, a Trellis decoder 52, a first data deinterleaver 53, a first Reed-Solomon decoder 54, and a data de-randomizer 55. The supplemental data processor 200 includes an MPEG header remover 57, a null sequence remover 58, a second data deinterleaver 59, and a second Reed-Solomon decoder 60.

According to the preferred embodiment, the demodulator 47 converts a RF band signal into a base band signal, and the synchronizing and timing recovery system (not shown) recovers a segment synchronizing signal, a field synchronizing signal, and a symbol timing. The comb filter 48 removes an NTSC interference signal, if detected, and the channel equalizer 49 corrects a distorted channel by using the slicer predictor 50.

The phase tracker 51 corrects a rotated phase, and the Trellis decoder 52 undertakes Viterbi decoding by using The generated sequence and the Viterbi algorithm. The channel equalizer 49, the slicer predictor 50, the phase tracker 51, and the Trellis decoder 52 process the received symbols by using the sequence generated at the sequence generator 46.

The first data deinterleaver 53 acts in reverse of the action of the data interleaver in the ATSC 8T VSB transmission system, and the first Reed-Solomon decoder 54 again decodes a signal Reed-Solomon coded at the ATSC 8T VSB transmission system. The data derandomizer 55 acts in reverse of the action of the data randomizer in the transmission system.

According to the preferred embodiment of the present invention the sequence generator 46 indicates if the received symbol is the supplement data symbol or not, and generates a sequence identical to the predefined sequence that is inserted and transmitted in the supplemental data.

The slicer predictor 50 is the ACS part of the trellis decoder. In other words, the slicer predictor 50 is a trellis decoder with decoding depth 0. The slicer predictor 50 estimates the state transistion sequence. After the ACS operation, the slicer predictor 50 estimates the maximum likely sequence and predicts one of the signal level groups on which the next symbol might fall.

As described above, the channel equalizer 49, the slicer predictor 50, the phase tracker 51, and the Trellis decoder 52 improve signal processing performances by using the predefined sequence. This occurs when the components using the predefined sequence use the sequence information with the delayed sequence information, taking the delay in data processing at prior components into account.

In the VSB reception system 300, the demultiplexer 56 demultiplexes the data from the modified legacy VSB receiver 100 into a supplemental data segment and an MPEG data segment by using the multiplexing information detected from, for example, the field synchronizing signal. In the preferred embodiment the first Reed-Solomon decoder 54 makes no Reed-Solomon decoding of the supplemental data segment, but only removes the 20 byte parity bits added at the Reed-Solomon coder in the VSB transmission system.

If the channel noise is excessive, many errors are present in the parity bytes of the Reed-Solomon code compared to the supplemental data because the parity bytes of the ATSC Reed-Solomon code has no predefined sequence inserted, resulting in no gain at the Trellis decoder 52. The first Reed-Solomon decoder 54 makes no Reed-Solomon decoding of the supplemental data segment because it is highly possible that the first Reed-Solomon decoder 54 makes an erroneous correction in the case where the supplemental data segment has an error in excess of, for example, 10 bytes.

The supplemental data segment from the demultiplexer 56 is provided to the MPEG header remover 57. The MPEG header remover 57 removes 3 bytes of MPEG header from the supplemental data segment. The MPEG header is inserted when the supplemental data is transmitted in an ATSC format at the VSB transmission system.

The null sequence remover 58 then removes the null sequence inserted in the supplemental data segment at the null sequence inserter in the VSB transmission system. The second data deinterleaver 59 acts in reverse of the interleaving process on the supplemental data segment in the VSB transmission system. If the interleaving process is omitted in the VSB transmission system, the VSB reception system 300 may disable the second deinterleaver 59 or not include it at all. The second Reed-Solomon decoder 60 decodes the Reed-Solomon code of the supplemental data segment.

The phase tracker 15 of the related art ATSC 8T-VSB reception system (shown in FIG. 2) also selectively uses the slicers therein in response to the slicer predictor. The phase tracker 51 of the VSB reception system 300 of the present invention is different from the related art VSB reception system in that the predefined sequence is used in the prediction and selection of the slicer. The phase tracker uses slicers to correct the phase error, so it also uses the slicer with the aid of slicer prediction from trellis decoder. The selective use of slicer of the phase tracker is the same with that of the equalizer.

Since the predefined sequence is inserted in the supplemental data symbol only, the VSB reception system 300 is required to identify the supplemental data symbol, and to determine whether the predefined sequence from the transmission system is '0' or '1'.

There are two methods for identifying information on the supplemental data symbol and the predefined sequence at the VSB reception system 300. In the first method, symbols of one field of one ATSC data frame are stored in advance in ROM (Read Only Memory). Since the data derandomizer of the ATSC 8T-VSB transmission system is initially synchronized to the field synchronizing signal, the cycles of the predefined sequence is also in field units. However, the fist method requires a large memory because the predefined sequence is required to be stored in field units according to a multiplexing method in the transmission system. In the second method, the VSB reception system has a transmitter for generating the predefined sequence as its own.

Figure 9:
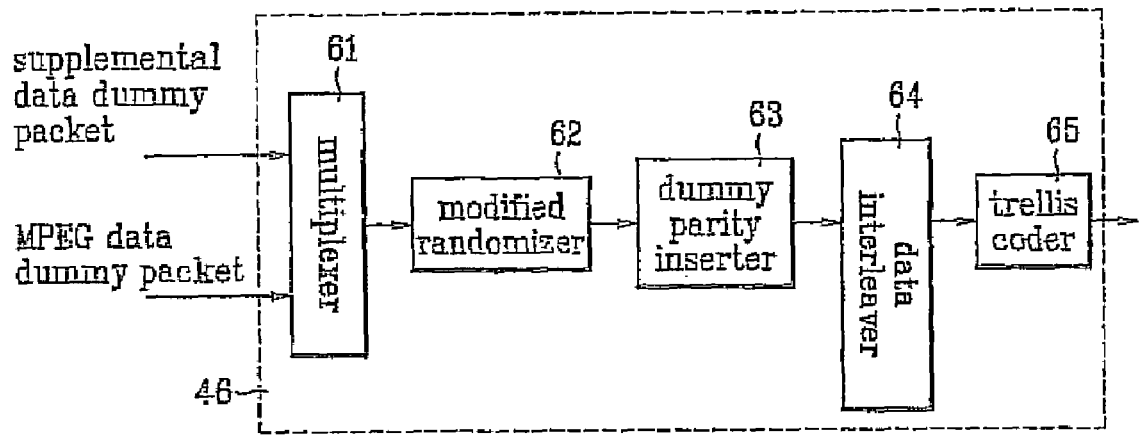
FIG. 9 illustrates a block diagram of a sequence generator in accordance with a preferred embodiment of the present invention.

FIG. 9 illustrates a block diagram of the sequence generator 46 in the reception system of the present invention according to the second method. The sequence generator 46 includes a multiplexer 61, a modified randomizer 62, a dummy parity inserter 63, a data interleaver 64, and a Trellis coder 65. The multiplexer 61 has a supplemental data dummy packet and an MPEG data dummy packet provided thereto. The MPEG data dummy packet produces 187 dummy bytes of 0×00. The supplemental data dummy packet produces three dummy bytes of 0×00 for the MPEG header bytes, and 184 dummy bytes of 0×AA for the supplemental data. Those dummy bytes are multiplexed at the multiplexer 61 and randomized at the modified randomizer 62.

The modified randomizer 62 randomizes the output of the multiplexer 61 by subjecting the intentionally produced pseudo random bytes and 0×55, for example, to bit-wise AND operation, and a resultant of the AND logical operation and input bits from the multiplexer 61 to bit-wise exclusive OR operation. Then, the dummy parity inserter 63 inserts the dummy bytes 0×00 of the 20 parities added by the Reed-Solomon coder of the ATSC 8T-VSB transmission system to the randomized data. The output of the dummy parity inserter 63 is interleaved at the data interleaver 64. The trellis coder 65 converts the interleaved dummy bytes into symbols and each byte produces four symbols. A detail of the Trellis coder 65 is shown in FIG. 7.

The symbols are provided to the 12 Trellis coder and precoders 32-1 to 32-12. The symbols are preferably not subjected to precoding and Trellis coding, but forwarded as provided. Each of the symbols finally forwarded thus has two bits D1 D0. In this instance, if the bit D1 is '1', the symbol is the supplemental data symbol, and if the bit d1 is '0', the bit D0 is the MPEG data symbol. If the bit D1 is '1', the bit D0 is the predefined sequence that is provided to the Trellis coder of the transmission system. The sequence generator 46 is operative synchronous to the field synchronizing signal recovered at the reception system.

Figure 10A:
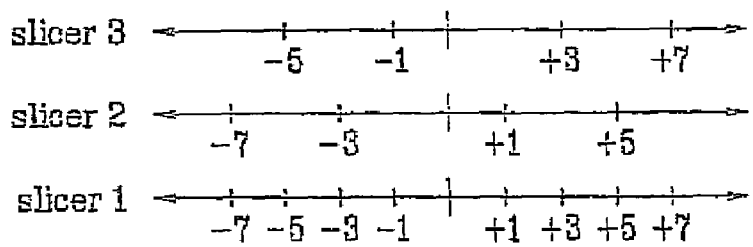
FIG. 10A illustrates signal level diagrams of slicers used for MPEG data symbols.

FIG. 10A illustrates signal level diagrams of three kinds of slicers used for MPEG data symbols used in the channel equalizer 49. Each slicer shows signal levels. Each slicer determines a signal that has the shortest distance to a signal received from the transmission system. If the prediction reliability of the slicer prediction is low, the slicer 1 having 8 levels is used. If the prediction reliability of the slicer is high, either the slicer 2 or the slicer 3 is selected according to a estimation of the register 28c in the coder 28 shown in a FIG. 5. If a value the register 28c estimated is '0', the slicer 2 is selected and if the estimated value is '1', the slicer 3 is selected.

Figure 10B:
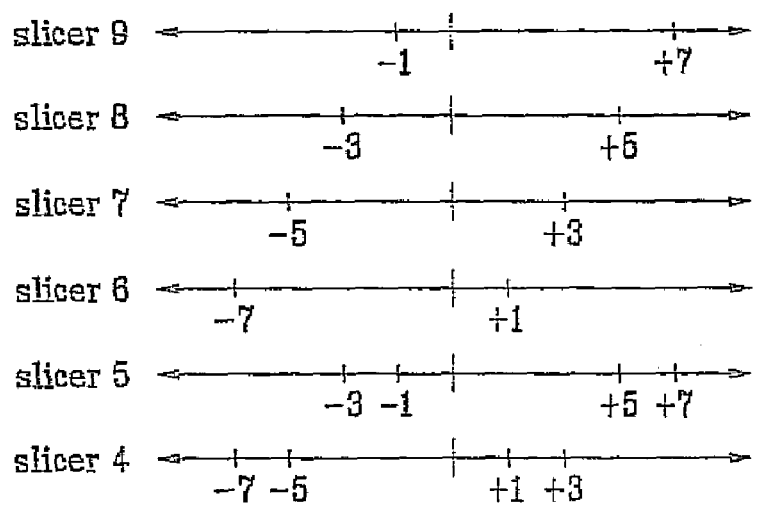
FIG. 10B illustrates signal level diagrams of slicers used for supplemental data symbols.

FIG. 10B illustrates signal level diagrams of six kinds of slicers used for supplemental data symbols. If the symbols are symbols of the supplemental data, the six slicers can be used by using the bit D1 of the predefined sequence. When the sequence bit D0 is '0', a signal level group transmitted from the VSB transmission system is (−7, −5, +1, +3). When the sequence bit D0 is '1', a signal level group transmitted from the VSB transmission system is (−3, −1, +5, +7). When the reliability of the slicer predictor is poor, either the slicer 4 or the slicer 5 is selected, depending on the value of the sequence bit D0.

A case when the slicer predictor has a high reliability will be discussed. When the sequence bit D0 is '0', the slicer 4 may be divided into two slicers of 6 and 7, according to a value stored in the register 28c of the Trellis coder 28. If the value stored in the register 28c is '0', the slicer 6 is selected, and if value stored is '1', the slicer 7 is selected.

If the sequence bit D0 is '1', the slicer 5 is divided into two slicers of slicer 8 and slicer 9, according to a value stored in the register 28c of the Trellis coder 28. Therefore, if the value stored in the register 28c is '0', the slicer 8 is selected, and if the value stored in the register 28c is '1', the slicer 9 is selected.

As discussed, the slicers 6, 7, 8, 9 in FIG. 10B may be compared to the related art slicers 2, 3 in FIG. 10A to find that a signal distance of the slicers 6, 7, 8, 9 is greater by two times than the related art slicers 2, 3. Therefore, in the case of the supplemental data symbol, slicers each having a greater slicer distance can be used with the use of a predefined sequence, resulting in a consequential reduction of decision error.

Figure 11:
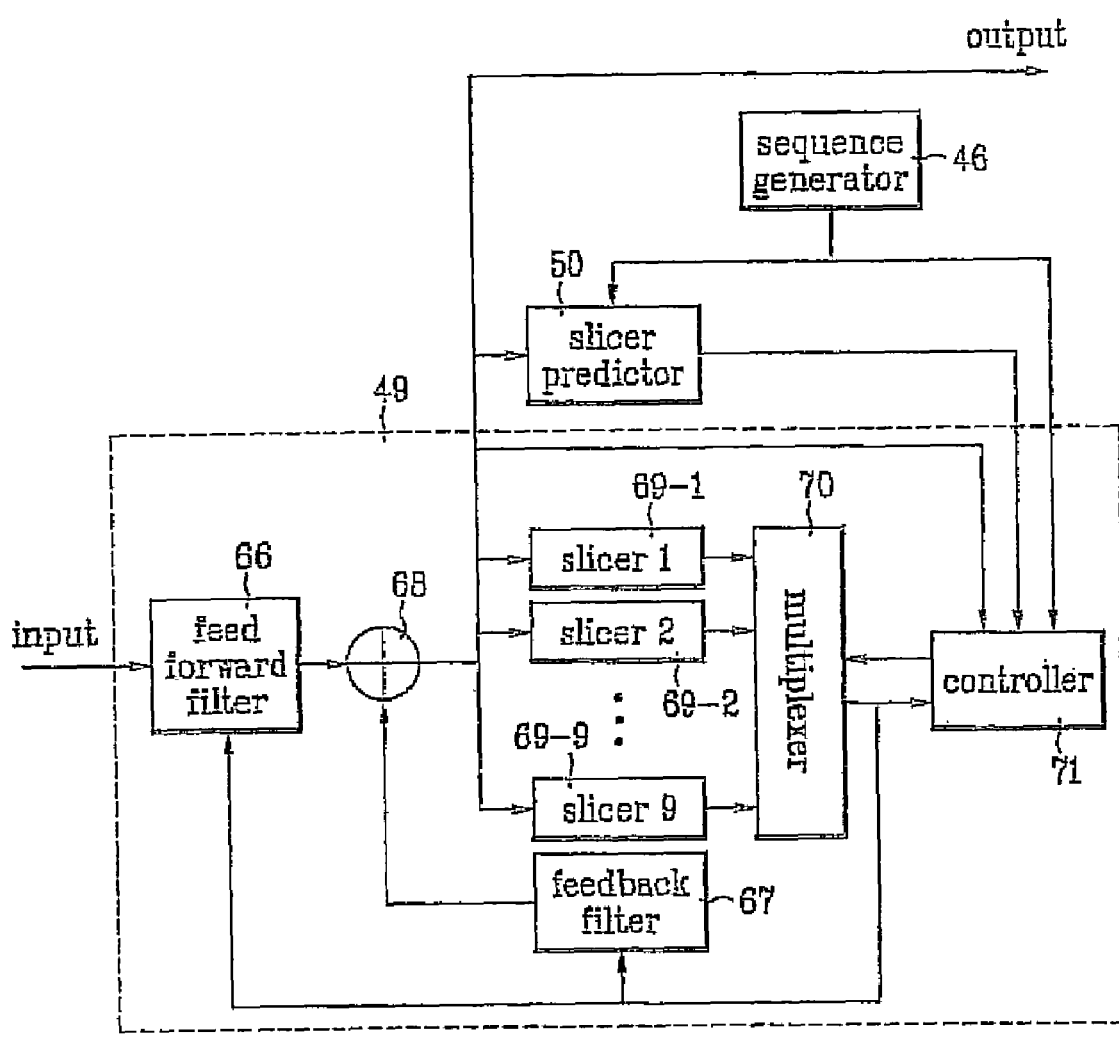
FIG. 11 illustrates a block diagram of a channel equalizer in accordance with a preferred embodiment of the present invention.

FIG. 11 illustrates a block diagram of a channel equalizer 49 of the VSB reception system 300 of the present invention using the predefined sequence. In FIG. 11, the channel equalizer includes a feed-forward filter 66, a feedback filter 67, an adder 68 for adding outputs of the filters 66 and 67, nine slicers 69-1 to 69-9, a multiplexer 70, and a controller 71.

According to the preferred embodiment, an input signal to the channel equalizer 49 is provided to the feed-forward filter 66, and an output signal of the feed-forward filter 66 and an output signal of the feedback filter 67 are added at the adder 68. An output signal of the adder 68 is an output signal of the channel equalizer 49. The output signal of the channel equalizer 68 is provided to the nine slicers 69-1 to 69-9 in common, for the slicers 69-1 to 69-9 to decide the signal level.

The controller 71 controls The multiplexer 70 such that the multiplexer 70 selects one of the outputs of the slicers 69-1 to 69-9 and provides to the feedback filter 67, and the controller 71. The controller 71 updates filter coefficients of the feed-forward filter 66 and the feedback filter 67 by using the selected slicer output and the output of the channel equalizer 49. As shown in FIG. 8, the slicer predictor 50 receives the output signal of the channel equalizer 49 and the output signal of the sequence generator 46, and predicts a value stored in the register 28c of the Trellis coder 28 in the VSB transmission system by using the received signals. The slicer predictor 50 then calculates the reliability of the predicted value, and forwards the values to the controller 71 of the channel equalizer 49.

The controller 71 of the channel equalizer 49 receives information on the symbol received as being the supplemental data or the MPEG data, and the predefined sequence D0 inserted in the supplemental data symbol from the sequence generator 46. The controller 71 receives the estimated value of the register 28c of the Trellis coder 28 in the transmission system together with the prediction reliability from the slicer predictor 50, and, selects one of the outputs of the nine slicers 69-1 to 69-9.

As described above, the VSB reception system 300 according to the preferred embodiment of the present invention has the forwarding advantages. First, the VSB reception system has components for processing both the MPEG data and the supplemental data.

Second, the sequence generator 46 provided in the VSB reception system 300 (for generating a predefined sequence as an input signal to a Trellis coder of a transmission system) can improve reception performance of the reception system with respect to a channel ghost signal and a noise signal over the related art ATSC 8T-VSB reception system. Particularly, performances of the slicer predictor and the Trellis coder in the reception system are significantly improved.

Third, by using the predefined sequence, the VSB reception system 300 can use slicers each having a greater signal distance than the conventional slicers at the channel equalizer and the phase tracker therein, which minimizes decision error. This enhances the tracker deghosting performance of the equalizer and the phase tracking performance of the phase tracker.

It will be apparent to those skilled in the art that various modifications and variations can be made in the VSB communication system, and the signal format for the VSB communication system of the present invention without departing from the spirit or scope of the invention. Thus, it is intended that the present invention cover the modifications and variations of this invention provided they come within the scope of the appended claims and their equivalents.

What is claimed is:

1. A digital television receiver, comprising:
   a demodulator adapted to demodulate an input signal containing first service data multiplexed with second service data;
   an information detector adapted to detect multiplexing information of the first and second service data from the demodulated signal;
   a first forward error correction (FEC) decoder adapted to decode the demodulated signal for first forward error correction (FEC) in order to correct errors in the first and second service data that occurred during reception of the input signal;
   a demultiplexer adapted to demultiplex the first service data and the second service data from the FEC-decoded signal using the detected multiplexing information; and
   a second forward error correction (FEC) decoder adapted to decode the demultiplexed first service data for second forward error correction (FEC) in order to additionally correct errors in the first service data that occurred during the reception of the input signal.

2. The digital television receiver of claim 1, wherein the first FEC decoder comprises a first Reed-Solomon (RS) decoder.

3. The digital television receiver of claim 2, wherein the first RS decoder is adapted to remove first parity data from the first and second service data.

4. The digital television receiver of claim 3, wherein the second FEC decoder comprises a second Reed-Solomon (RS) decoder.

5. The digital television receiver of claim 4, wherein the second RS decoder is adapted to remove second parity data from the demultiplexed first service data.

6. The digital television receiver of claim 5, wherein a length of the first parity data is different from a length of the second parity data.

7. The digital television receiver of claim 6, wherein the length of the first parity data is less than the length of the second parity data.

8. The digital television receiver of claim 1, wherein the second FEC decoder is further adapted to reorder the demultiplexed first service data.

9. The digital television receiver of claim 1, further comprising an MPEG header remover adapted to remove MPEG headers from the demultiplexed first service data.

10. The digital television receiver of claim 1, further comprising a data deinterleaver adapted to deinterleaver the first and second service data in the demodulated signal.

11. The digital television receiver of claim 1, further comprising a channel-equalizer adapted to channel-equalize the demodulated signal.

12. The digital television receiver of claim 1, further comprising a trellis decoder adapted to decode the demodulated signal using a Viterbi decoding algorithm.

13. The digital television receiver of claim 1, wherein the demodulator is further adapted to detect sync information from the input signal.

14. A method of decoding a digital broadcast signal, the method comprising:
   demodulating an input signal containing first service data multiplexed with second service data;
   detecting multiplexing information of the first and second service data from the demodulated signal;
   decoding the demodulated signal for first forward error correction (FEC) in order to correct errors in the first and second service data that occurred during reception of the input signal;
   demultiplexing the first service data and the second service data from the FEC-decoded signal using the detected multiplexing information; and
   decoding the demultiplexed first service data for second forward error correction (FEC) in order to additionally correct errors in the first service data that occurred during the reception of the input signal.

15. The method of claim 14, wherein decoding the demodulated signal for first FEC comprises Reed-Solomon (RS) decoding the first and second service data in the demodulated signal.

16. The method of claim 15, wherein RS decoding the first and second service data comprises removing first parity data from the first and second service data.

17. The method of claim 16, wherein decoding the demultiplexed first service data for second FEC comprises Reed-Solomon (RS) decoding the demultiplexed first service data.

18. The method of claim 17, wherein IRS decoding the demultiplexed first service data comprises removing second parity data from the demultiplexed first service data.

19. The method of claim 18, wherein a length of the first parity data is different from a length of the second parity data.

20. The method of claim 19, wherein the length of the first parity data is less than the length of the second parity data.

21. The method of claim 14, further comprising reordering the demultiplexed first service data.

22. The method of claim 14, further comprising removing MPEG headers from the demultiplexed first service data.

23. The method of claim 14, further comprising deinterleaving the first and second service data in the demodulated signal.

24. The method of claim 14, further comprising channel-equalizing the demodulated signal.

25. The method of claim 14, further comprising decoding the demodulated signal using a Viterbi decoding algorithm.

26. The method of claim 14, further comprising detecting sync information from the input signal.

27. A broadcast transmitter, comprising:
- a first forward error correction (FEC) coder adapted to code first service data for first forward error correction (FEC) in order to reduce errors in the first service data that occur during data transmission;
- a multiplexer adapted to multiplex the FEC-coded first service data, second service data, and multiplexing information of the first and second service data;
- a second forward error correction (FEC) coder adapted to code the multiplexed first and second service data for second forward error correction (FEC) in order to reduce errors in the first and second service data that occur during data transmission; and
- a modulator adapted to modulate the FEC-coded first and second service data for data transmission.

28. The broadcast transmitter of claim 27, wherein the first FEC coder comprises a first Reed-Solomon (RS) coder.

29. The broadcast transmitter of claim 28, wherein the first RS coder adapted to add first parity data to the first service data.

30. The broadcast transmitter of claim 29, wherein the second FEC coder comprises a second Reed-Solomon (RS) coder.

31. The broadcast transmitter of claim 30, wherein the second RS coder adapted to add second parity data to the multiplexed first and second service data.

32. The broadcast transmitter of claim 31, wherein a length of the first parity data is different from a length of the second parity data.

33. The broadcast transmitter of claim 32, wherein the length of the first parity data is greater than the length of the second parity data.

34. The broadcast transmitter of claim 27, wherein the first FEC coder is further adapted to reorder the first service data.

35. The broadcast transmitter of claim 27, further comprising an MPEG header inserter adapted to insert MPEG headers in the FEC-coded first service data.

36. The broadcast transmitter of claim 27, further comprising a data interleaver adapted to interleave the FEC-coded first and second service data.

37. The broadcast transmitter of claim 27, further comprising a trellis coder adapted to trellis-code the FEC-coded first and second service data.

38. The broadcast transmitter of claim 27, further comprising a mapper adapted to map the FEC-coded first and second service data into corresponding symbols.

39. The broadcast transmitter of claim 27, further comprising a frame formatter adapted to add sync information to the FEC-coded first and second service data.

40. A method of encoding a digital broadcast signal, the method comprising:
- coding first service data for first forward error correction (FEC) in order to reduce errors in the first service data that occur during data transmission;
- multiplexing the FEC-coded first service data, second service data, and multiplexing information of the first and second service data;
- coding the multiplexed first and second service data for second forward error correction (FEC) in order to reduce errors in the first and second service data that occur during data transmission; and
- modulating the FEC-coded first and second service data for data transmission.

41. The method of claim 40, wherein coding the first service data for first FEC comprises Reed-Solomon (RS) coding the first service data.

42. The method of claim 41, wherein RS coding the first service data comprises adding first parity data to the first service data.

43. The method of claim 42, wherein coding the multiplexed first and second service data comprises Reed-Solomon (RS) coding the multiplexed first and second service data.

44. The method of claim 43, wherein RS coding the multiplexed first and second service data comprises adding second parity data to the multiplexed first and second service data.

45. The method of claim 44, wherein a length of the first parity data is different from a length of the second parity data.

46. The method of claim 45, wherein the length of the first parity data is greater than the length of the second parity data.

47. The method of claim 40, further comprising reordering the first service data.

48. The method of claim 40, further comprising inserting MPEG headers into the FEC-coded first service data.

49. The method of claim 40, further comprising interleaving the FEC-coded first and second service data.

50. The method of claim 40, further comprising trellis-coding the FEC-coded first and second service data.

51. The method of claim 40, further comprising mapping the FEC-coded first and second service data into corresponding symbols.

52. The method of claim 40, further comprising adding sync information to the FEC-coded first and second service data.

* * * * *